(12) United States Patent
Vassilev et al.

(10) Patent No.: US 10,534,061 B2
(45) Date of Patent: Jan. 14, 2020

(54) CALIBRATION ARRANGEMENT AND A METHOD FOR A MICROWAVE ANALYZING OR MEASURING INSTRUMENT

(71) Applicant: Gapwaves AB, Göteborg (SE)

(72) Inventors: Vessen Vassilev, Lindome (SE); Per-Simon Kildal, Pixbo (SE); Sofia Rahiminejad, Göteborg (SE)

(73) Assignee: GAPWAVES AB, Gothenburg (SE)

( * ) Notice: Subject to any disclaimer, the term of this patent is extended or adjusted under 35 U.S.C. 154(b) by 207 days.

(21) Appl. No.: 15/565,163

(22) PCT Filed: Apr. 4, 2016

(86) PCT No.: PCT/SE2016/050277
§ 371 (c)(1),
(2) Date: Oct. 8, 2017

(87) PCT Pub. No.: WO2016/163932
PCT Pub. Date: Oct. 13, 2016

(65) Prior Publication Data
US 2018/0113187 A1    Apr. 26, 2018

(30) Foreign Application Priority Data
Apr. 8, 2015 (SE) ..................... 1550412

(51) Int. Cl.
*G01R 31/00* (2006.01)
*G01R 35/00* (2006.01)
*G01R 27/28* (2006.01)

(52) U.S. Cl.
CPC ........... *G01R 35/005* (2013.01); *G01R 27/28* (2013.01)

(58) Field of Classification Search
CPC ........ G01R 27/22; G01R 27/26; G01R 27/28; G01R 27/32; G01R 35/005; G01R 35/007
See application file for complete search history.

(56) References Cited

U.S. PATENT DOCUMENTS 4,959,614 A * 9/1990 Bowling ............... G01N 22/00
                                                324/601
5,587,934 A    12/1996 Oldfield et al.
(Continued)

FOREIGN PATENT DOCUMENTS

EP    2363719 A1    9/2011
GB    2337604 A    11/1999
WO    2010/003808    1/2010

OTHER PUBLICATIONS

Sweden Patent and Registration Office, Int'l Search Report in PCT/SE2016/050277, dated Aug. 9, 2016.
(Continued)

*Primary Examiner* — Minh N Tang
(74) *Attorney, Agent, or Firm* — Jeffrey S. Melcher; Melcher Patent Law PLLC

(57) ABSTRACT

An apparatus for calibration of an electronic instrument, such as a vector network analyzer, includes a number of calibrator connector elements for connection to the instrument, and a plate element including a plurality of calibration waveguide structures. The plate element has conductive surfaces, and the calibrator connector elements and conductive surfaces include periodic structures disposed with respect to each other such that gaps are formed between them. An interface enables interconnection of a waveguide of a calibrator connector element, a waveguide of the instrument, and a calibration waveguide structure. The apparatus includes a driving unit and controller for moving the plate element and/or the calibrator connector element to connect the calibrator connector element to different calibration waveguide structures.

24 Claims, 5 Drawing Sheets

(56) References Cited

U.S. PATENT DOCUMENTS

| | | | |
|---|---|---|---|
| 5,854,559 A | 12/1998 | Miranda et al. | |
| 6,218,845 B1 | 4/2001 | Bunch et al. | |
| 7,112,970 B2 * | 9/2006 | Kreager | G01R 1/0408 324/601 |
| 7,157,918 B2 * | 1/2007 | Adamian | G01R 35/005 324/601 |
| 2004/0051538 A1 | 3/2004 | Adamian | |
| 2013/0342288 A1 | 12/2013 | Lau | |

OTHER PUBLICATIONS

Extended European Search Report issued in corresponding European Patent Application No. 16776989.2, dated Jan. 4, 2019 pp. 1-5.
Supplemental European Search Report issued in corresponding European Patent Application No. 16776989.2, dated Jan. 22, 2019, pp. 1.

* cited by examiner

CALIBRATION ARRANGEMENT AND A METHOD FOR A MICROWAVE ANALYZING OR MEASURING INSTRUMENT

TECHNICAL FIELD

The present invention relates to a calibration arrangement for a tool or instrument for analyzing or measuring microwave circuits or devices, having the features of the first part of claim 1. With microwave instrument is here also meant devices for frequencies up to and above THz frequency, particularly if rectangular waveguide technology is used.

The invention also relates to an arrangement for connecting an analyzing or measuring instrument, e.g. Vector Network Analyzer, to a waveguide calibration standard or a device under test according to present invention.

The invention also relates to a method for calibration of such a tool or instrument, being e.g. a Vector Network Analyzer (VNA), or transmission lines, having the features of present invention.

BACKGROUND

For analyzing microwave circuits and devices of vastly different kinds, from filters, amplifiers etc. to much more complex multifunction systems, Vector Network Analyzers, VNA:s, are widely used. Such an instrument is capable of evaluating the characteristics of a circuit or a device to be analyzed through measuring the scattering parameters (S-parameters), and operate as a signal source and a signal receiver measuring magnitude and phase and magnitude of transmission and reflection, i.e. the S-parameters.

However, it is of utmost importance to be able to calibrate the VNA in order to provide useful measurement results of the highest accuracy. Generally a calibration is performed using a number of known standards, which are measured and transferred to the VNA, and errors hence removed from the VNA.

Therefore it is known to use so-called calibration kits comprising a number of standards. A number of standards are connected to the ports of a VNA to perform and verify calibrations. This is a very time-consuming process requiring expert skill and high precision. The calibration process is therefore prone to errors.

Moreover, the use of high frequencies is steadily gaining more interest. Up to about 67 GHz coaxial cables can be used as transmission lines, and therefore standard coaxial connectors are used on the calibration kits. However, for frequencies above 67 GHz rectangular waveguides are used instead of cables, and therefore the calibration kits are provided with standard waveguide flanges to be used as connectors to the equivalent flanges on the circuit or device to be tested.

For lower frequencies, when coaxial cables are used, known calibration kits comprise a plurality of coaxial connector standards. The coaxial cable technology makes it possible to use flexible cables with connectors on both ends between the calibration kit and the VNA. Such flexible cables make the measurement setup easy to handle.

However, for higher frequencies, e.g. from about 67 GHz up to about 1 THz, when waveguides need to be used, the situation is much more complicated. The rectangular waveguides are normally rigid, and when connecting two opposing waveguide flanges together there is required a high quality of both mechanical and electrical contact between them, in order to obtain a high quality, a repeatable and non-radiating interface, and thereby also a good calibration.

Known calibration kits consist of waveguide calibration standards such as matched loads, short circuited lines of different lengths (referred to as shorts), and straight waveguides of given lengths (referred to as throughs). These are screwed on to or between the ports of the network analyzer (VNA) in a calibration sequence. In a typical calibration procedure the operator has to connect the flanges of the calibration standards and the ports of the VNA together a plurality of times. This is a very time consuming, complicated and tedious task, due to all the screws needed to make good contact between all joining flanges. It requires a stable and repeatable contact both mechanically and electrically, and therefore four screws are always used. If the connection is not perfect, e.g. if there is a slight angular displacement or if there is not a perfect fit, there may be a leakage from the waveguide into free space, and also increased reflection at the connection. The calibration procedure is based on all such connections being as perfect as possible, for the most accurate measurements.

SUMMARY

It is therefore an object of the present invention to provide a calibration arrangement through which one or more of the above-mentioned problems can be overcome.

It is particularly an object to provide a calibration arrangement, which is easy to use and operate.

It is also an object to provide a calibration arrangement allowing calibration against a large number of waveguide calibration standards in a fast and easy manner.

It is also an object to provide a calibration arrangement which enables calibration in a fast and reliable manner with a minimum of screwing and unscrewing joining waveguide flanges.

It is a particular object to provide a calibration arrangement which can be used for waveguides, and for high frequencies, e.g. above 67 GHz, without any risk of calibration errors due to misalignment or leakage between flanges.

Particularly it is an object to provide a calibration arrangement which is easy and cheap to fabricate.

A most particular object is to provide a calibration arrangement which is suitable for being scaled to be used in measurement systems for high as well as low frequencies, in connection with different standard waveguides dimensions (such as WR15, WR12, . . . WR3) and the corresponding standard waveguide flange dimensions.

It is also an object to provide a calibration arrangement for waveguide measurements in general. Therefore an arrangement as initially referred to is provided which has the characterizing features of the present invention.

Still further it is an object to provide a method for calibrating a VNA or similar, or a circuit in general, particularly with waveguide flanges, through which one or more of the above mentioned problems are overcome.

Therefore a method as initially referred to is provided which has the characterizing features of the present invention.

A further object is to provide an arrangement for connecting an analyzing or measuring instrument to a waveguide calibration standard or a device under test in such a way that existing calibration standards can be used in an easier and faster manner than before.

Therefor a connection arrangement having the characterizing features of the present invention is provided.

Advantageous embodiments are given by the respective appended dependent claims.

BRIEF DESCRIPTION OF THE DRAWINGS

The invention will in the following be further described in a non-limiting manner, and with reference to the accompanying drawings, in which.

DETAILED DESCRIPTION

Figure 1:
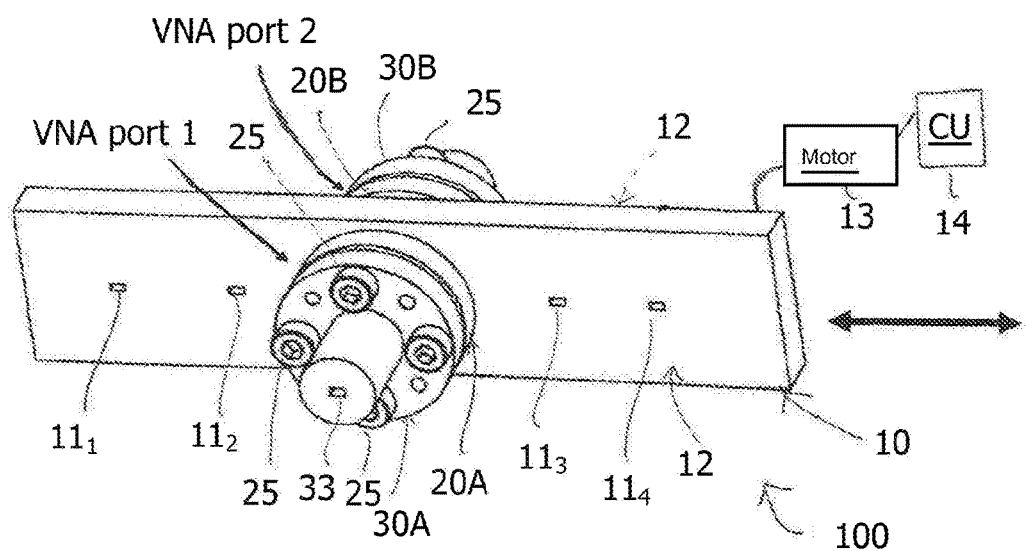
FIG. 1 is a view of a calibration arrangement according to a first embodiment of the present invention.

FIG. 1 shows a first embodiment of a calibration arrangement 100 according to the invention. The calibration arrangement 100 is located between the two ports of a VNA during calibration, marked VNA port 1 and 2 in the figure, and is thereafter replaced by the circuit or device under test (DUT) during the actual measurement. Thereby, the number of times each of the VNA ports have to be connected and disconnected during calibration is reduced from three or four times per port to once per port. This saves calibration time and makes calibration more accurate.

The calibration arrangement 100 comprises a plate element 10 which comprises, or inside which are mounted, a plurality of waveguide calibration standards. These are visible in FIG. 1 at the surfaces on both sides of the plate 10 as rectangular waveguide openings $11_1$, $11_2$, $11_3$, $11_4$, $11_5$. The plate element 10 here comprises an elongate plate with calibration waveguide structures $11_1$, $11_2$, $11_3$, $11_4$, $11_5$ (only inputs/outputs explicitly shown) disposed along the longitudinal extension of the plate element 10. The opposite outer sides of the plate element 10 comprise conductive surfaces 12,12. The calibration arrangement further comprises calibrator connector elements or flanges 20A,20B adapted to be disposed on either sides of the plate element 10 for connection to the VNA or DUT by means of the standard waveguide flanges 30A,30B used there.

Figure 2:
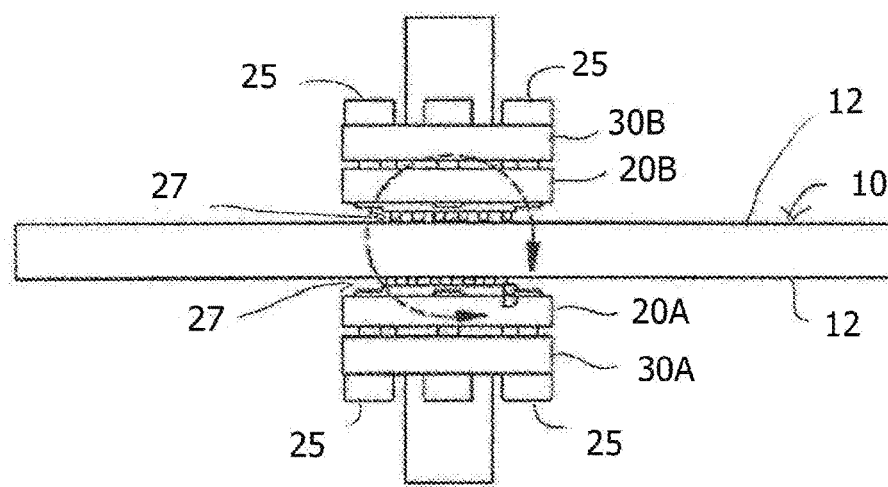
FIG. 2 is a cross-sectional view from above of the calibration arrangement in FIG. 1.
Figure 5:
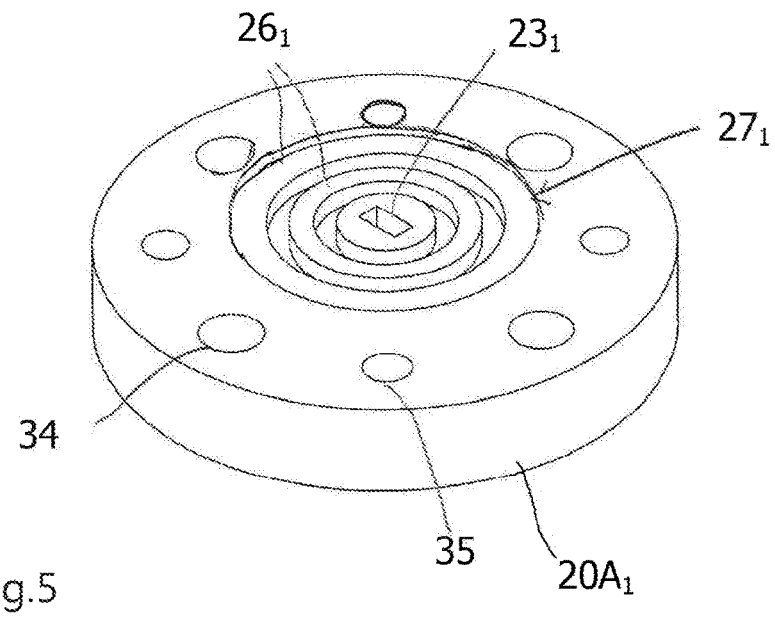
FIG. 5 is a view in perspective of an exemplary alternative calibrator connector element comprising a flange with a periodic structure according to another embodiment of the invention.

I must be emphasized that the drawings in FIGS. 1, 2 and 5 are schematic and do not include the surrounding support structure. The flanges 20A,20B are in reality fixed to the surrounding housing structure which has arrangements that allow the plate 10 to move in such a way that the different waveguide openings can coincide one after the other with the waveguide openings in the middle of the two flanges 20A,20B, during the calibration procedure.

Figure 4:
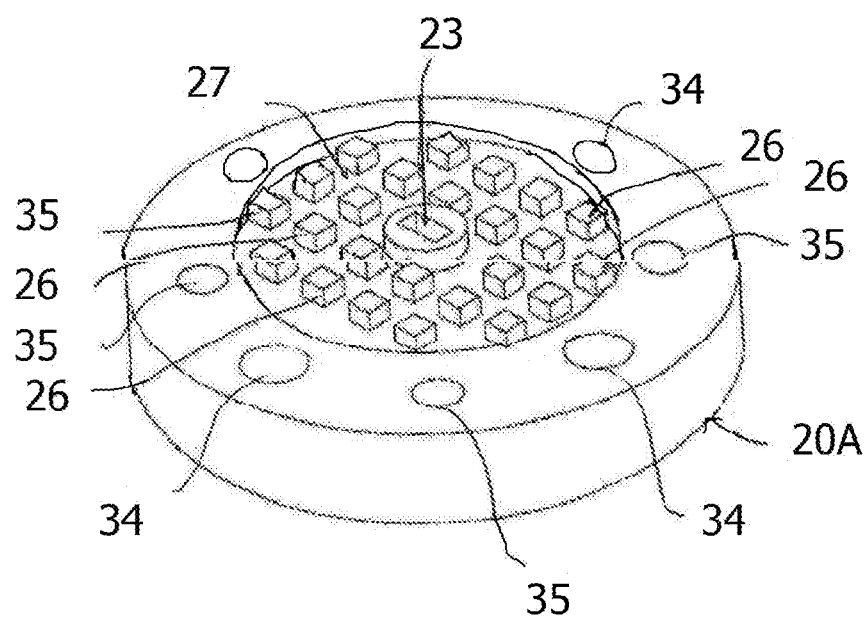
FIG. 4 is a view in perspective of an exemplary calibrator connector element comprising a flange with a periodic structure according to one embodiment of the invention.

Each calibrator connector element 20A,20B in the shown embodiment comprises a flange element on a central portion of which a periodical or quasi-periodic texture or structure 27 (in this document referred to as a structure) is disposed around the standard rectangular waveguide opening 23 (see FIG. 4). It should be clear that in alternative embodiments the calibrator connector element or the flange element may have any other appropriate shape, e.g. a rectangular shape.

The periodic structure 27 may comprise a corrugated structure e.g. as shown in FIG. 5, or a structure comprising a plurality of pins 26 as shown in FIG. 4. In the embodiment of FIG. 4 the pins have a square shaped cross-section (see FIG. 4), but they can also have other cross sections such as circular or rectangular.

Through providing a connection between a conductive smooth flange surface or plane 12 on one side and another flange surface with a periodic structure 27 on the other side, two waveguide openings (e.g. that of a waveguide calibration standard and that of a VNA waveguide port) can be connected without requiring mechanical contact. Thus, the presence of a gap 29, e.g. of air, or a gap filled with gas, vacuum, or at least partly with a dielectric material, between the two connecting flange surfaces is allowed since the periodic structure stops all kind of wave propagation between the two flange surfaces. The periodic structure, also denoted texture, is so designed that it stops propagation of waves inside the gap 29 in any other direction inside the gap 29, whereas the wave is allowed to pass across the gap from the waveguide opening in one flange surface to the waveguide opening in the other, at least at the intended frequency band of the calibrations or measurements. Thus, the shape and dimensions and the arrangement of e.g. pins, posts, grooves, ridges etc. of the periodic structure are selected such as to prevent propagation of waves in any other direction than the intended direction.

The non-propagating or non-leaking characteristics between two surfaces of which one is provided with a periodic texture (structure), is known from P.-S. Kildal, E. Alfonso, A. Valero-Nogueira, E. Rajo-Iglesias, "Local metamaterial-based waveguides in gaps between parallel metal plates", IEEE Antennas and Wireless Propagation letters (AWPL), Volume 8, pp. 84-87, 2009 and several later publications by these authors. The non-propagating characteristic appears within a specific frequency band, referred to as a stopband. Therefore, the periodic texture and gap size must be designed to give a stopband that covers with the operating frequency band of the standard waveguide being considered in the calibration kit. It is also known that such stopbands can be provided by other types of periodic structures, as described in E. Rajo-Iglesias, P.-S. Kildal, "Numerical studies of bandwidth of parallel plate cut-off realized by bed of nails, corrugations and mushroom-type EBG for use in gap waveguides", IET Microwaves, Antennas & Propagation, Vol. 5, No 3, pp. 282-289, March 2011. These stopband characteristics are also used to form so called gap waveguides as described in Per-Simon Kildal, "Waveguides and transmission lines in gaps between parallel conducting surfaces", patent application No. PCT/EP2009/057743, 22 Jun. 2009.

It must be emphasized that any of periodic or quasi-periodic textures previously used or that will be used in gap waveguides also can be used in the calibration kit and the connecting arrangement of the present invention, and is covered by the patent claims.

The concept of using a periodic texture to improve waveguide flanges is known from P.-S. Kildal, "Contactless flanges and shielded probes", European patent application EP12168106.8, 15 May 2012.

According to the present invention, the two surfaces, e.g. the conductive surface or plane 12 and the plane of the periodic structure, i.e. the plane formed by the free outer ends of the pins or ridges of a corrugated structure 27, must not be separated more than a quarter of a wavelength of a transmitted signal, or rather have to be separated less than a quarter wavelength. This is thoroughly described in the above-mentioned publications, such as in particular in E. Rajo-Iglesias, P.-S. Kildal, "Numerical studies of bandwidth of parallel plate cut-off realized by bed of nails, corrugations and mushroom-type EBG for use in gap waveguides", IET Microwaves, Antennas & Propagation, Vol. 5, No 3, pp. 282-289, March 2011.

The periodic structure 27 in particular embodiments (cf. FIG. 4) comprises an array of pins 26 with a cross section e.g. having the dimensions of $0.15\lambda \times 0.15\lambda$, and a height of $0.15$-$0.25\lambda$. Through the provisioning of an interface formed by said conductive surface 12 on one side of the interface and the periodic structure 27 on the other side of the interface, power is prevented from leaking through the gap 29 between the calibrator connector element waveguide 23, interconnected with e.g. a VNA waveguide 33, and the calibration waveguide structures (see also FIG. 3).

According to the invention, by using a combination of a surface comprising a periodic structure 27 and a conductive surface 12, or between two surfaces each provided with a periodic structure (see e.g. FIG. 3B) waveguides can hence be connected without the surfaces having to be in mechanical contact, which in turn removes the requirement for any fastening means such as screws or similar to connect the surfaces, which in known arrangements is a requirement as discussed above, and in addition for calibration against each calibration standard.

Through admitting a gap between the surfaces 12,27, or at least not requiring any mechanical fastening to keep the surfaces in contact, a plate element 10 containing a plurality of standards and a calibrator connector element 20A,20B can be arranged movably with respect to one another, so that for a waveguide connected by means of a waveguide connector element 30A,30B to a calibrator connector element 20A,20B, and through displacement of the calibrator connector element 20A,20B and the plate 10 containing a plurality of calibration standards, with respect to one another, different calibration standards provided by means of calibration waveguide openings $11_1$, $11_2$, $11_3$, $11_4$, $11_5$ can be applied to the waveguide 33. The waveguides can be said to be automatically, mechanically switched without requiring any attaching/detaching between the applications of different calibration standards, but all calibration standards of a frequency band can be run through automatically.

In the embodiment shown in FIG. 1, the plate element 10 is movable inside the supporting housing by means of actuation of a motor 13. e.g. an electric motor, (only very schematically illustrated since it should be clear that a motor 13 adapted to control a linear movement (arrow T in FIG. 1) of a plate element can be provided for in different manners and it can be of many different kinds). The motor 13 is controlled by means of a control unit 14 to connect the calibrator connector elements 20A,20B, which are connected to the waveguide connector elements 30A,30B, to different calibration standards by means of, or formed by, the calibration waveguide structures $11_1$, $11_2$, $11_3$, $11_4$, $11_5$ automatically one after the other in any desired order. Hence the ports of the VNA via the waveguide connector elements 30A,30B will be connected to the different calibration standards without having to disconnect the waveguide connector elements 30A,30B from the calibrator connector elements 20A,20B.

Thus a whole, or parts of, a calibration sequence can be performed automatically without requiring involvement of any operator, which is extremely advantageous. The waveguide connector element 30A,30B, in this embodiment, only needs to be fastened, by screws 25 or similar, once to the calibrator connector element 20A,20B for performing an entire calibration sequence with a plurality of standards. In advantageous embodiments the calibration standards short, offset short, through (thru) lines with different delays and matched load are provided on the plate element 10. Combinations of these calibration standards are used for different calibration procedures and calibration quality verification and assurance.

It should be clear that the calibration waveguide structures, the calibration standards, in alternative embodiments may have any other appropriate cross-section, e.g. circular. The calibrator connector elements may in some embodiments comprise transitions for example between a rectangular and a circular waveguide. It should also be clear that the calibration standards can be circular or rectangular etc. irrespectively of whether the calibrator connector elements or the waveguide connector elements comprise circular or rectangular waveguides.

The invention is of course not limited to the above mentioned calibration standards, but is equally applicable to other calibration standards, in addition or solely, or to only some of these calibration standards.

In a calibration arrangement comprising a calibration kit, different calibrator connector element 20A,20B with different periodic structures and differently sized waveguide openings are preferably provided for different frequency bands, since different dimensions of the periodic structure are needed for different frequency bands.

FIG. 2 is a view from above of the calibration arrangement 100 of FIG. 1 illustrating the arrangement of the movable plate element 10 with conductive surfaces 12,12 and the periodic structures 27 with pins 26 of the calibrator connector elements 20A, 20B with respect to one another such that a gap 29,29 is provided there between. The waveguide connector elements 30A,30B are in an advantageous embodiment connected to the calibrator connector elements 20A,20B by means of screws 25,25, although also other fastening means than screws alternatively may be used.

Figure 3:
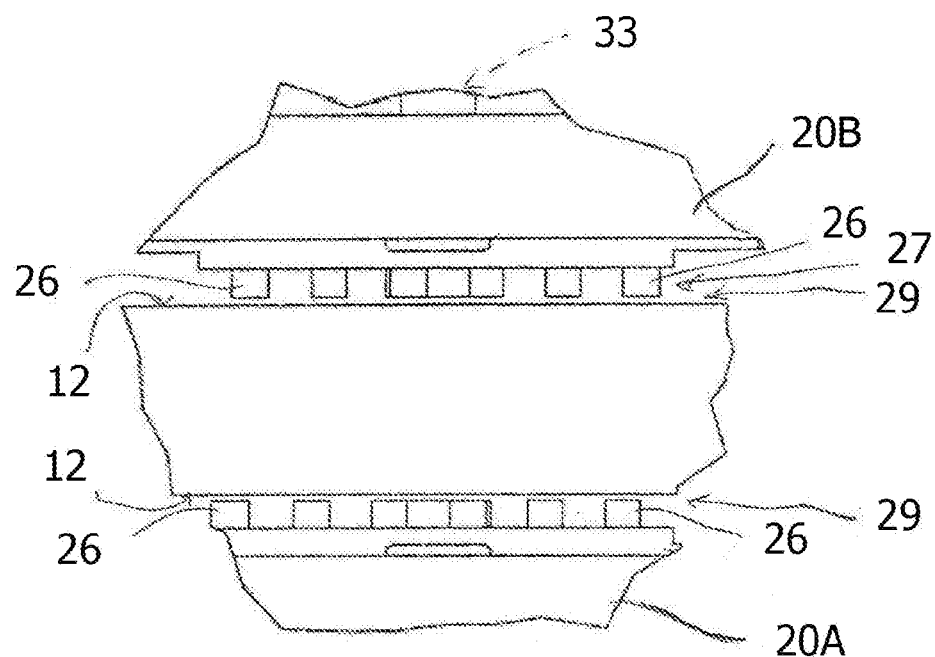
FIG. 3 is an enlarged view of the section indicated through the arrow B in FIG. 2.

FIG. 3 is an enlarged view of the section indicated B in FIG. 2 for the purposes of more clearly illustrating part of the movable plate element 10 with conductive surfaces 12,12 and parts of the calibrator connector elements 20A, 20B with periodic structures 27,27, here comprising a plurality of pins 26. The gaps 29,29 between respective plate element conductive surfaces 12,12 and the periodic structures 27,27 can be seen, and the fact that a gap 29 is allowed, due to the periodic structures 27 on one side of a waveguide interface, between the VNA waveguide being indicated through a dashed line and the calibrator connector element waveguide, and the conductive surface 12 on the other, enables the relative displacement between the surfaces 12,27 as also discussed above.

Figure 3A:
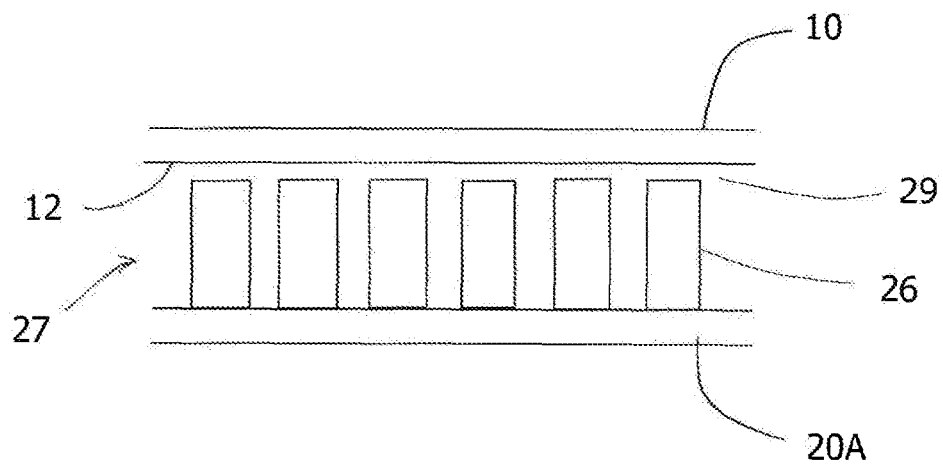
FIG. 3A is a schematic side view of a periodic structure between a calibrator connector element and the plate element in an embodiment as in FIG. 2.

FIG. 3A is a schematic side view in cross section of the calibrator connector element 20A with a periodic structure 27 comprising a plurality of pins or protruding elements 26 and the plate element 10 with a conductive surface 12 and the air gap 29.

Figure 3B:
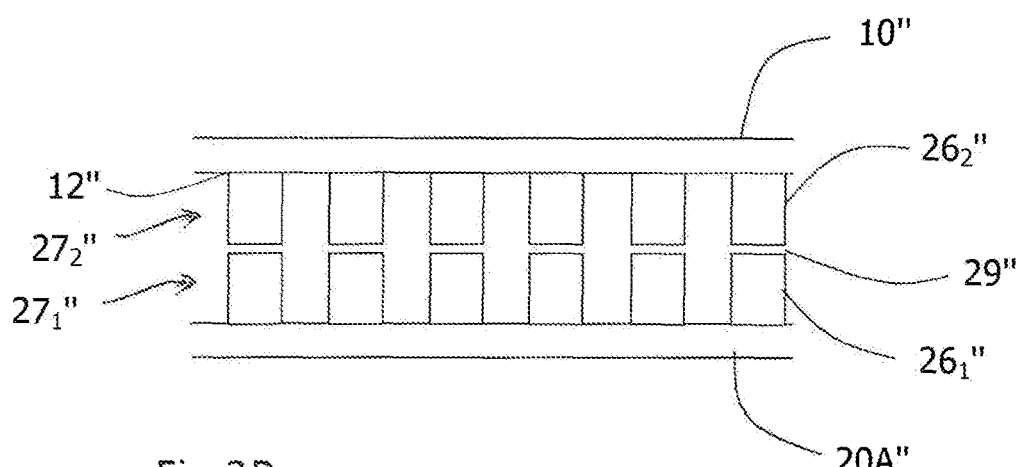
FIG. 3B is a schematic side view of an alternative embodiment of a periodic structure between a calibrator connector element and a plate element.

FIG. 3B is a schematic side view in cross section of an alternative embodiment in which a calibrator connector element 20A" comprises a plurality of pins or protruding elements $26_1$" of a first height and the conductive surface 12" of the plate element 10" also comprises a plurality of pins or protruding elements $26_2$", here of the same height as the pins or protruding elements $26_1$" of the calibrator connector element 20A". Two periodic structures $27_1$", $27_2$" are hence formed by each a plurality of pins or protruding elements $26_1$", $26_2$" provided on both the calibrator connector element 20A" and the plate element 10" such that an air gap 29" is formed there between, thus forming two sets of pins or protruding elements. In some embodiments the pins or protruding elements of the two sets all are of the same height, each pin or protruding element having a length corresponding to half the total length of the pin or protruding element required to form the desired stop band.

In still other alternative embodiments different heights are used for the different sets of pins or protruding elements or corrugations (not shown). In still other embodiments the lengths or heights of the pins or protruding elements, or corrugations, vary within the respective sets (not shown), as long as the total length of one another facing, or oppositely disposed, pins, protruding elements or corrugations corresponds to a length required for the desired stop band. Such arrangements of protruding elements are disclosed in the European patent application "Waveguide and transmission lines in gaps between parallel conducting surfaces", EP15186666.2, filed on 24 Sep. 2015 by the same applicant.

FIG. 4 is a view in perspective showing a calibrator connector element 20A comprising a flange with a periodic structure 27 comprising a number of square shaped pins 26, here with the cross-sectional area dimension of $(0.15\lambda)^2$ and a height of $0.15$-$0.25\lambda$, surrounding a waveguide 23. As referred to above, the width, or cross-sectional dimension/the height of the pins or corrugations of any appropriate kind is determined by the frequency band for which the measurements/calibrations are to be performed. The higher the frequency band, the smaller the dimensions, and the dimensions scale linearly with the wavelength; the higher the frequency, the smaller the wavelength $\lambda$, and the smaller the dimensions. It should be clear that, for a frequency band, $\lambda$ is the wavelength of the center frequency of the corresponding frequency band. In FIG. 4 threaded holes 34 (which may be through or not) are provided for fastening means 25 (see FIG. 2) for connection to a waveguide connector element (see FIG. 2) and holes 35 for alignment pins ensuring alignment between calibrator connector element and the plate element, i.e. the waveguides, are illustrated.

FIG. 5 is a view in perspective showing another alternate calibrator connector element $20A_1$ comprising a flange with a periodic structure $27_1$ comprising a corrugated structure with a plurality of concentrically disposed corrugations with grooves $26_1$ surrounding a waveguide opening $23_1$. In FIG. 5 also the holes 34 for fastening means 25 (see FIG. 2) for connection to a waveguide connector element (see FIG. 2) and holes 35 for alignment pins are illustrated.

It should be clear that a periodic structure may also be provided through differently disposed corrugations, on either or both of a calibrator connector element and a plate element, in still other embodiments.

Figure 6:
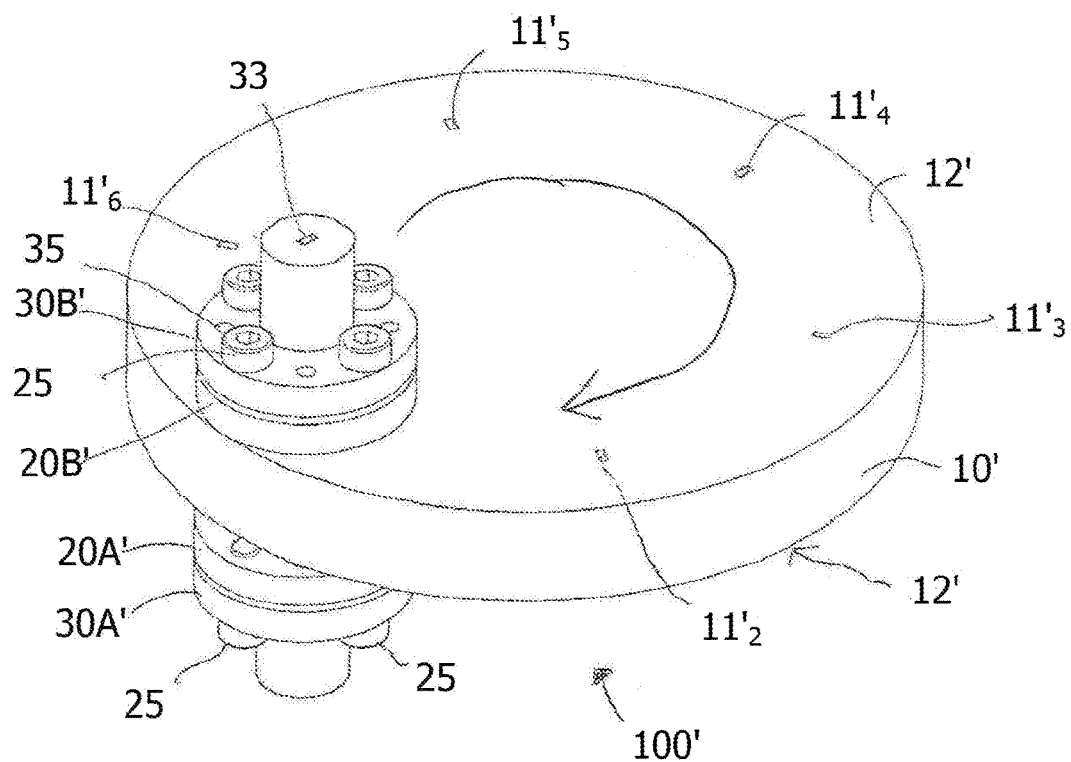
FIG. 6 is a schematic view of an alternative calibration arrangement according to the invention.

FIG. 6 is a schematic illustration of an alternative embodiment in which the plate element 10' instead is adapted to perform a rotational translation with respect to the calibrator connector elements 20A',20B' connecting to waveguide connector elements 30A',30B' forming ports of e.g. a VNA. The plate element 10' is in this embodiment circular, and the calibration waveguide structures $11_1'$, $11_2'$, $11_3'$, $11_4'$, $11_5'$, $11_6'$ comprising the calibration standards (calibration waveguide structure $11_1'$ not explicitly shown since the waveguide connector element 20B' is connected thereto in FIG. 6) are, instead of being disposed in a linear manner along the longitudinal extension of an elongate plate, distributed and disposed at a distance from an outer edge of the circular plate element 10' with conductive surfaces 12',12'. Similar to the embodiment shown in FIG. 1, waveguide connector elements 30A',30B' are fastened to the calibrator connector elements 20A',20B' by means of fastening means 25, e.g. screws or bolts. A control unit (not shown) controls the rotational movement of the plate element 10' through a central axis (not shown) and sequence of application of different calibration standards etc. as also described with reference to e.g. FIG. 1. In all other aspects the construction and function of the calibration arrangement 100' is similar to that described with reference to FIGS. 1-4.

Figure 7:
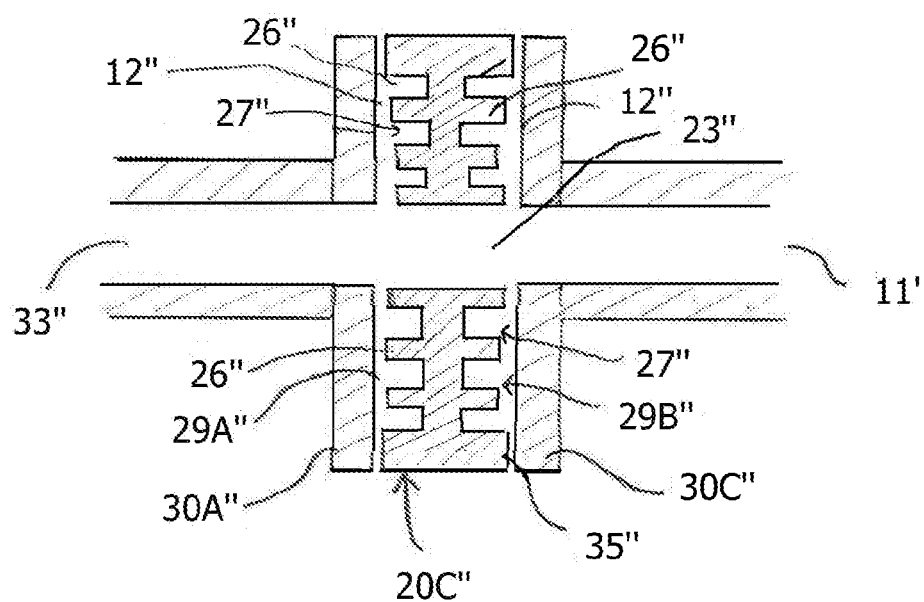
FIG. 7 is a cross sectional view of an arrangement for connecting an analyzing or measuring instrument to a waveguide calibration standard or a device under test in which a calibration connector element is connected directly between two waveguide flanges and is provided with a periodic structure on both sides.

FIG. 7 shows a connection arrangement comprising a calibration connector element 20C" with a periodic or quasi-periodic structure on both sides, referred to as a flange gap adapter, only comprising surfaces, hence no flanges. This makes it possible to avoid screws even when connecting the flanges 30A" of the VNA port to the calibration connector element 20C", and the flanges 30C" of a DUT or a separate calibration standard 30C" to the opposite side of the calibration connector element 20C". 11" in FIG. 7 indicates a port of a DUT or a calibration standard, whereas 33" indicates a VNA port. The outer rings 35" of calibration connector element 20C" ensures a well-defined gap between the textured surfaces of the calibration connector element and the flange surfaces of 30A",30C".

Gaps 29A",29B" on the two sides of the calibration connector element 20C" are formed between the periodic structures 27",27" thereof and the conductive surfaces 12", 12".

Similar elements bear the same reference numerals as in the preceding embodiments, but with a double prime, and will not be further discussed herein, although it should be clear that they can be varied in the same manner, e.g. as far as shapes, dimensions, periodic structure and location thereof etc. are concerned.

Thus, also these calibration connector elements or flange gap adapters are free elements that can be mounted e.g. with alignment pins (as referred to in FIGS. 4,5 above) between respective calibration standard and VNA-ports, and between VNA-ports and DUT-ports when measuring. Thus, in such a case existing calibration standards can be used, without any fastening means, and only with alignment pins. Actually, the flange screws or bolts can be removed, and only the alignment pins or similar are needed.

Thus, the alignment can be assured with alignment pins whereas the axial tolerance is not so critical due to the textured surfaces of the flange gap adapter. Then, we may also use a normal calibration kit, so that there is no need for a special plate 12 as in the other illustrated embodiments. By means of such flange gap adapters the use of existing separate calibration standards is allowed, which is very advantageous, and an easier and simpler calibration with existing separate calibration standards is enabled.

It should be noted that the gap between surfaces is described as a gap and it can be a small gap. However, the gap can also be zero. The main point is that, since there is no requirement for any electrical contact between the two surfaces, there is no need for any screws or similar to ensure electrical contact.

It should be clear that the calibrator connector elements can have different shapes and dimensions and that also the plate element can have different shapes and dimensions, and still further that a relative motion, allowing automatic connection to different standards on the plate, between calibrator connector elements and plate can be provided for in different manners.

In one advantageous embodiment there are four ports instead of two, the calibration arrangement e.g. being adapted to be used with a 4-port VNA, and comprising four calibration connector elements.

It should also be clear that the invention is not limited to any particular type of calibrator, calibration or waveguide connector elements or connector locations or plate element shapes, types of periodic structures, location of periodic structure, e.g. on calibrator connector element and/or plate element, materials etc. but that these features are freely variable within the scope of the appended claims.

Also the driving and the controlling functions may be provided for in different manners by different means. Particularly the movement of the plate element, and hence the connection to different calibration standards, including selection of calibration standards, sequence etc. is computer controlled via what here is denoted a control unit.

Thus, preferably the calibration procedure is performed by a computer, which controls the calibration sequence, makes necessary corrections of the presence of the waveguide sections (calibrator connector elements), calculates calibration coefficients and transfers them to the VNA.

It should be clear that the control functionality may be provided by an external or separate control unit e.g. as schematically illustrated in FIG. 1. Alternatively the control functionality for controlling the calibration procedure, e.g. the calibration sequence, may be carried out by a control functionality of the VNA itself.

It should be clear that also in other aspects the invention can be varied in many different ways. The inventive concept may also be used for performing waveguide measurements in general, or adaptable waveguide interconnection e.g. for testing purposes, or any other purpose.

It is particularly an advantage that a calibration arrangement is provided which is easy to fabricate, mount, control, and in particular to operate.

It is also an advantage that a connection arrangement is provided which facilitates the use of existing calibration standards.

The invention claimed is:

1. A calibration apparatus for calibration of an electronic instrument, comprising:
a number of calibrator connector elements that enable the electronic instrument to be connected thereto;
a plate element, comprising a plurality of calibration waveguide structures having a number of different calibration standards, wherein the plate element on a number of sides thereof has a conductive surface, each calibrator connector element and/or the conductive surface of the plate element comprises a surface having a periodic or quasi-periodic structure, each calibrator connector element connecting to the plate element such that a waveguide interface is formed by the conductive surface and the surface of the respective calibrator connector element when the calibrator connector element is positioned at a calibration waveguide structure, the plate element and respective calibrator connector element then being so disposed with respect to one another that a gap is formed therebetween that enables the calibrator connector element and the plate element to move with respect to each other, and
a driving unit and a controller for moving the plate element and/or the calibrator connector element and connection of the calibrator connector element to different calibration waveguide structures, thereby enabling interconnection of a waveguide of the electronic instrument connected to the calibrator connector element comprising a waveguide to the different calibration standards.

2. The calibration apparatus of claim 1, wherein the gap is smaller than a quarter of a wavelength or a center frequency wavelength of a corresponding waveguide frequency band of a waveguide signal to be calibrated/measured.

3. The calibration apparatus of claim 1, comprising at least two calibrator connector elements disposed on opposite sides of the plate element.

4. The calibration apparatus of claim 3, comprising four calibrator connector elements.

5. The calibration apparatus of claim 1, wherein each calibrator connector element releasably connects with a waveguide connector element to a device under test by fasteners and is aligned by cooperating alignment pins and holes.

6. The calibration apparatus of claim 1, wherein the plate element comprises an elongate plate element, the calibration waveguide structures being disposed in a row along a longitudinal extension of the elongate plate element, and the elongate plate element is linearly translatable by the driving unit for locating each calibrator connector element at each of the calibration waveguide structures in a sequence under control of the controller.

7. The calibration apparatus of claim 1, wherein the plate element comprises a circular plate element, calibration waveguide structures being disposed at a distance from a periphery of the circular plate element, and the circular plate element is rotatable by the driver for locating calibrator connector elements at each of the calibration waveguide structures in a sequence under control of the controller.

8. The calibration apparatus of claim 1, wherein the periodic or quasi-periodic structure comprises a plurality of pins or protruding elements having square-shaped cross-sections.

9. The calibration apparatus of claim 8, wherein cross-sections of the plurality of pins or protruding elements are approximately $0.15\lambda \times 0.15\lambda$, and A is a wavelength of a center frequency of the respective waveguide, and heights of the plurality of pins or protruding elements are approximately $0.15\lambda$-$0.25\lambda$.

10. The calibration apparatus of claim 1, wherein the periodic or quasi-periodic structure comprises a plurality of pins or protruding elements having circular cross-sections.

11. The calibration apparatus of claim 10, wherein pins or protruding elements have heights of approximately $0.15\lambda$-$0.25\lambda$, and A is a wavelength of a center frequency of the respective waveguide.

12. The calibration apparatus of claim 1, wherein the periodic or quasi-periodic structure comprises a corrugated surface that produces a cut-off for a wave propagating in the gap between the plate element and respective calibrator connector element.

13. The calibration apparatus of claim 1, wherein each calibrator connector element comprises a surface with a periodic or quasi-periodic structure, and the plate element comprises a smooth conductive surface.

14. The calibration apparatus of claim 1, wherein each calibrator connector element comprises a surface with a first periodic or quasi-periodic structure comprising a first set of pins or protruding elements, and the plate element comprises a conductive surface with a second periodic or quasi-periodic structure comprising a second set of pins or protruding elements, each pin or protruding element of the first set being disposed so as to face a respective pin or protruding element of the second set.

15. The calibration apparatus of claim 14, wherein either lengths or heights of the pins or protruding elements of the first and second sets are the same, each having substantially half a total length required to form a desired stop band, or lengths or heights of the pins or protruding elements of the first and second sets are different, a total length of two pins or protruding elements facing each other corresponding substantially to the total length required to form the desired stop band.

16. The calibration apparatus of claim 1, further comprising a calibration kit having a plurality of sets of calibrator connector elements, each set comprising a number of calibrator connector elements with a periodic or quasi-periodic structure having dimensions adapted for a specific frequency band.

17. The calibration apparatus of claim 1, wherein the controller comprises a computer of a vector network analyzer.

18. An apparatus for connection to an electronic instrument during calibration and measurements, comprising:
    a calibration connector element, comprising a disk or plate with a waveguide hole for location between two waveguide flanges, thereby forming a contactless connection between the two waveguide flanges;
    wherein one of the waveguide flanges is a port of the electronic instrument and the other of the waveguide flanges is a port configured for connection to either a waveguide calibration standard having a waveguide port or a device under test having a waveguide port; and
    the calibration connector element further comprises two surfaces on respective sides of the calibration connector element, each surface having a respective periodic or quasi-periodic structure around the waveguide hole, the calibration connector element connecting between the waveguide flanges with respective gaps formed between the respective periodic or quasi-periodic structures and the respective waveguide flange.

19. The apparatus of claim 18, wherein the respective gaps are smaller than either a quarter of a wavelength or a wavelength of a center frequency of the waveguide flanges.

20. The apparatus of claim 18, wherein each periodic or quasi-periodic structure comprises a plurality of pins, protruding elements, or posts that have square-shaped, rectangular, or circular cross-sections.

21. The apparatus of claim 20, wherein the cross-sections of the plurality of pins, protruding elements, posts are approximately $0.15\lambda \times 0.15\lambda$, A is a wavelength of a center frequency of the respective waveguide flange, and the cross-sections have heights of approximately between $0.15\lambda$ and $0.25\lambda$.

22. The apparatus of claim 18, wherein the respective periodic or quasi-periodic structure comprises a corrugated surface that cuts off waves propagating in the respective gaps.

23. A method of calibrating an electronic instrument, comprising:
    providing a number of calibrator connector elements connected to a plate element comprising a number of calibration waveguide structures comprising a number of different calibration standards disposed in the plate element, the plate element having conductive surfaces on a number of sides thereof, wherein each calibrator connector element comprises a surface with a periodic or quasi-periodic structure and/or the conductive surfaces of the plate element comprise respective periodic or quasi-periodic structures, and gaps between conductive surfaces and respective periodic structures form respective waveguide interfaces;
    connecting a waveguide connector element to a respective waveguide interface with a fastener to a calibrator connector element such that a waveguide of the electronic instrument is connected to a waveguide of the calibrator connector element; and
    performing a calibration sequence by controllably moving the plate element and/or the calibrator connector elements with respect to one another such that selected calibrator connector elements are moved from one calibration waveguide structure to another.

24. The method of claim 23, wherein the gaps is less than either a quarter of a wavelength of a signal to be measured or a wavelength of a center frequency of the respective waveguide structure, and the method further comprises selecting calibrator connector elements depending on a frequency band of signals to be calibrated by selecting a calibrator connector element having a periodic structure with dimensions adapted to the frequency band.

* * * * *